(12) United States Patent
Cheng et al.

(10) Patent No.: US 9,627,511 B1
(45) Date of Patent: Apr. 18, 2017

(54) VERTICAL TRANSISTOR HAVING UNIFORM BOTTOM SPACERS

(71) Applicant: International Business Machines Corporation, Armonk, NY (US)

(72) Inventors: Kangguo Cheng, Schenectady, NY (US); Juntao Li, Cohoes, NY (US); Geng Wang, Stormville, NY (US); Qintao Zhang, Mt Kisco, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/188,476

(22) Filed: Jun. 21, 2016

(51) Int. Cl.
| | | |
|---|---|---|
| *H01L 29/78* | (2006.01) | |
| *H01L 29/66* | (2006.01) | |
| *H01L 27/088* | (2006.01) | |
| *H01L 21/8234* | (2006.01) | |
| *H01L 21/265* | (2006.01) | |
| *H01L 21/3065* | (2006.01) | |

(52) U.S. Cl.
CPC ...... *H01L 29/66553* (2013.01); *H01L 21/265* (2013.01); *H01L 21/3065* (2013.01); *H01L 21/823412* (2013.01); *H01L 21/823418* (2013.01); *H01L 27/0886* (2013.01); *H01L 29/66666* (2013.01); *H01L 29/7827* (2013.01)

(58) Field of Classification Search
CPC ... H01L 29/66; H01L 29/78; H01L 29/66553; H01L 29/66666; H01L 27/08; H01L 27/0886; H01L 21/26; H01L 21/265; H01L 21/30; H01L 21/306; H01L 21/3065; H01L 21/82; H01L 21/823; H01L 21/8234; H01L 21/82341; H01L 21/823412; H01L 21/823418
USPC ........................................................ 257/329
See application file for complete search history.

(56) References Cited

U.S. PATENT DOCUMENTS

| | | | |
|---|---|---|---|
| 7,446,025 B2 | 11/2008 | Cohen et al. | |
| 7,521,752 B2 * | 4/2009 | Kinoshita | ......... H01L 21/82341 257/302 |
| 8,076,717 B2 * | 12/2011 | Sandhu | ............... H01L 29/7827 257/296 |
| 8,629,038 B2 | 1/2014 | Liu | |
| 8,872,172 B2 | 10/2014 | Cheng et al. | |
| 8,975,697 B2 | 3/2015 | Cheng et al. | |
| 9,054,126 B2 | 6/2015 | Wang et al. | |
| 9,059,211 B2 | 6/2015 | Chudzik et al. | |
| 9,076,523 B2 | 7/2015 | Lee et al. | |
| 9,196,707 B2 | 11/2015 | Chudzik et al. | |
| 9,246,005 B2 | 1/2016 | Basker et al. | |
| 9,263,585 B2 | 2/2016 | Pham et al. | |
| 9,299,837 B2 | 3/2016 | Cheng et al. | |
| 9,324,830 B2 | 4/2016 | He et al. | |

(Continued)

*Primary Examiner* — Monica D Harrison
(74) *Attorney, Agent, or Firm* — Cantor Colburn LLP; Vazken Alexanian

(57) ABSTRACT

A method of forming a spacer for a vertical transistor is provided. The method includes forming a fin structure that includes a fin on a semiconductor substrate, forming a source junction or a drain junction at an upper surface of the semiconductor substrate and at a base of the fin and epitaxially growing a rare earth oxide (REO) spacer to have a substantially uniform thickness along respective upper surfaces of the source or drain junction and on opposite sides of the fin structure.

20 Claims, 7 Drawing Sheets

(56) References Cited

U.S. PATENT DOCUMENTS 9,385,195 B1 * 7/2016 Zhang ................ H01L 29/1033
2007/0007579 A1   1/2007 Scheuerlein et al.

* cited by examiner

US 9,627,511 B1

VERTICAL TRANSISTOR HAVING UNIFORM BOTTOM SPACERS

BACKGROUND

The present invention relates to semiconductor devices, and more specifically, to fabrication methods and resulting structures for a vertical transistor having uniform bottom spacers.

As demands to reduce the dimensions of transistor devices continue, new designs and fabrication techniques to achieve a reduced device footprint are developed. Vertical-type transistors such as vertical field effect transistors (vertical FETs) have recently been developed to achieve a reduced FET device footprint without comprising necessary FET device performance characteristics. When forming these vertical FETS, spacers need to be provided between and around vertical structures.

SUMMARY

According to a non-limiting embodiment of the present invention, a method of forming a spacer for a vertical transistor is provided. The method includes forming a fin structure that includes a fin on a semiconductor substrate and forming a source junction or a drain junction at an upper surface of the semiconductor substrate and at a base of the fin. The method further includes epitaxially growing a rare earth oxide (REO) spacer to have a substantially uniform thickness along respective upper surfaces of the source or drain junction and on opposite sides of the fin structure.

According to another non-limiting embodiment, a method of forming a uniform spacer for vertical transistors is provided. The method includes forming first and second fin structures on a semiconductor substrate where the first and second fin structures each include a fin and sacrificial spacers on respective sidewalls of the fin. The method further includes forming source/drain (S/D) junctions at an upper surface of the semiconductor substrate and at respective bases of the fins of each of the first and second fin structures. The method further includes epitaxially growing a rare earth oxide (REO) spacer to have a substantially uniform thickness along respective upper surfaces of the S/D junctions between and at opposite sides of each of the first and second fin structures.

According to yet another non-limiting embodiment, a vertical transistor structure is provided and includes a semiconductor substrate, first and second fins extending upwardly from first and second doped regions of the semiconductor substrate, respectively, and first and second vertical transistor structures disposed on the first and second fins, respectively. The vertical transistor structure further includes an epitaxially grown rare earth oxide (REO) spacer having a substantially uniform thickness. The REO spacer is disposed between respective upper surfaces of the first and second doped regions of the semiconductor substrate and respective lower surfaces of the first and second vertical transistor structures and between and at opposite sides of the first and second fins.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other features of the invention are apparent from the following detailed description taken in conjunction with non-limiting embodiments illustrated in the accompanying drawings. In particular, FIGS. 1-14 are a series of views illustrating a method of forming a vertical FET device according to exemplary embodiments of the present teachings, in which:

FIG. 1 is a side view of a semiconductor substrate with fin structures formed thereon;

FIG. 2 is a side view of a semiconductor substrate and fin structures with sacrificial spacers formed on sidewalls of the fin structures;

FIG. 3 is a side view of a semiconductor substrate, fin structures, sacrificial spacers formed on sidewalls of the fin structures and doped regions formed in the semiconductor substrate;

FIG. 4 is a side view of a semiconductor substrate, fin structures, sacrificial spacers formed on sidewalls of the fin structures, doped regions formed in the semiconductor substrate and epitaxially grown rare earth oxide (REO) spacers grown on upper surfaces of doped regions of the semiconductor substrate;

FIG. 5 is a side view of a semiconductor substrate, fin structures, partially removed sacrificial spacers, doped regions formed in the semiconductor substrate and epitaxially grown rare earth oxide (REO) spacers grown on upper surfaces of doped regions of the semiconductor substrate FIG. 6 is an enlarged view of the encircled portion of FIG. 5;

FIG. 7 is a side view of an initial stage of vertical field effect transistor (VFET) formation having been executed on the structures of FIG. 5;

FIG. 8 is a side view of a formation of a gate cut mask;

FIG. 9 is a side view of an intermediate stage of vertical field effect transistor (VFET) formation having been executed using the gate cut mask of FIG. 8;

FIG. 10 is a side view of an intermediate stage of vertical field effect transistor (VFET) formation following an etching process;

FIG. 11 is a side view of an intermediate stage of vertical field effect transistor (VFET) formation following top spacer layer formation;

FIG. 12 is a side view of an intermediate stage of vertical field effect transistor (VFET) formation following interlayer dielectric layer deposition;

FIG. 13 is a side view of an intermediate stage of vertical field effect transistor (VFET) formation following top source/drain contact growth; and FIG. 14 is a side view of an intermediate stage of vertical field effect transistor (VFET) formation following continued metal contact formation processing.

DETAILED DESCRIPTION

Figure 1:
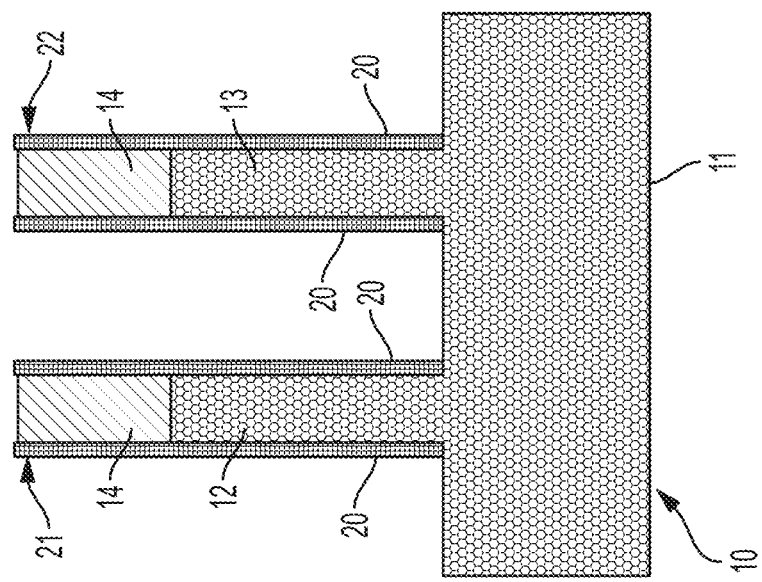

Various embodiments of the present disclosure are described herein with reference to the related drawings. Alternative embodiments may be devised without departing from the scope of this disclosure. It is noted that various connections and positional relationships (e.g., over, below, adjacent, etc.) are set forth between elements in the following description and in the drawings. These connections and/or positional relationships, unless specified otherwise, may be direct or indirect, and the present disclosure is not intended to be limiting in this respect. Accordingly, a coupling of entities may refer to either a direct or an indirect coupling, and a positional relationship between entities may be a direct or indirect positional relationship. As an example of an indirect positional relationship, references in the present disclosure to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The term "exemplary" is used herein to mean "serving as an example, instance, or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

For the sake of brevity, conventional techniques related to semiconductor device and IC fabrication may not be described in detail herein. Moreover, the various tasks and process steps described herein may be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that may be utilized in implementing one or more embodiments of the present disclosure will now be provided. Although specific fabrication operations used in implementing one or more embodiments of the present disclosure may be individually known, the disclosed combination of operations and/or resulting structures of the present disclosure are unique. Thus, the unique combination of the operations described in connection with the fabrication of a coupler system according to the present disclosure utilize a variety of individually known physical and chemical processes performed on a semiconductor (e.g., silicon) substrate. In general, the various processes used to form a micro-chip that will be packaged into an IC fall into three categories, namely, film deposition, patterning, etching and semiconductor doping. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Fundamental to all of the above-described fabrication processes is semiconductor lithography, i.e., the formation of three-dimensional relief images or patterns on the semiconductor substrate for subsequent transfer of the pattern to the substrate. In semiconductor lithography, the patterns are a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of the present disclosure, one or more embodiments provide a vertical-type semiconductor structure (e.g., a vertical FET or VFET) and include an epitaxially grown rare earth oxide (REO) spacer that is oriented horizontally and has a substantially uniform thickness. The REO spacer is epitaxially grown on a crystalline semiconductor substrate and can be built into VFET structures and systems having a variety of spacing between adjacent fins. For example, the spacing between adjacent fins may range from 10 nm to 50 nm, although larger or narrower spacing are also conceived. The use of an epitaxial growth process to form the REO spacer, according to the present disclosure, provides better control over spacer uniformity and spacer thickness than known spacer fabrication techniques such as deposition and recess fabrication processes.

Turning now to a more detailed description of the present disclosure, with reference to FIG. 1, a semiconductor structure 10 for fabrication of a vertical-type semiconductor device such as a vertical FET or VFET, for example, is illustrated according to a non-limiting embodiment. The semiconductor structure 10 generally extends along a plane and includes a semiconductor substrate 11, a first fin 12, a second fin 13 and hard masks 14 for each of the first and second fins 12 and 13. The semiconductor substrate 11 may be provided as a bulk semiconductor substrate or as a semiconductor-on-insulator (SOI) substrate as understood by one of ordinary skill in the art. In at least one embodiment, the material of the semiconductor substrate 11 may be silicon (Si) though other semiconductor substrate materials are possible.

The first fin 12 extends vertically upwardly from an uppermost surface layer of the semiconductor substrate 11 and may be formed of similar or different materials as the semiconductor substrate 11. Similarly, the second fin 13 extends vertically upwardly from the uppermost surface layer of the semiconductor substrate 11 and also may be formed of similar or different materials as the semi-conductor substrate 11. The hard masks 14 are provided on the uppermost surface layers of the first and second fins 12 and 13 and may be formed of any hard mask material that would be appropriate for patterning the first and second fins 12 and 13.

Figure 2:
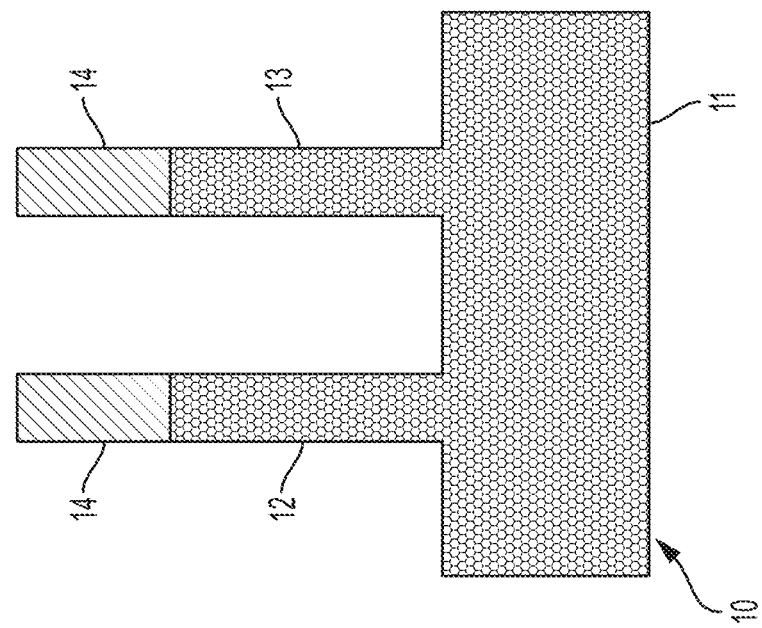

With reference to FIG. 2, sacrificial spacers 20 are formed on sidewalls of the first and second fins 12 and 13 to in turn form resulting first and second fin structures 21 and 22, respectively. Each of the sacrificial spacers 20 may extend from the uppermost surface layer of the semiconductor substrate 11 to the hard masks 14 and may be formed of silicon nitride (SiN) or another similar sacrificial spacer material. The sacrificial spacers 20 may be formed, for example, from a deposition of silicon nitride and subsequent reactive ion etch (RIE) processing.

Figure 3:
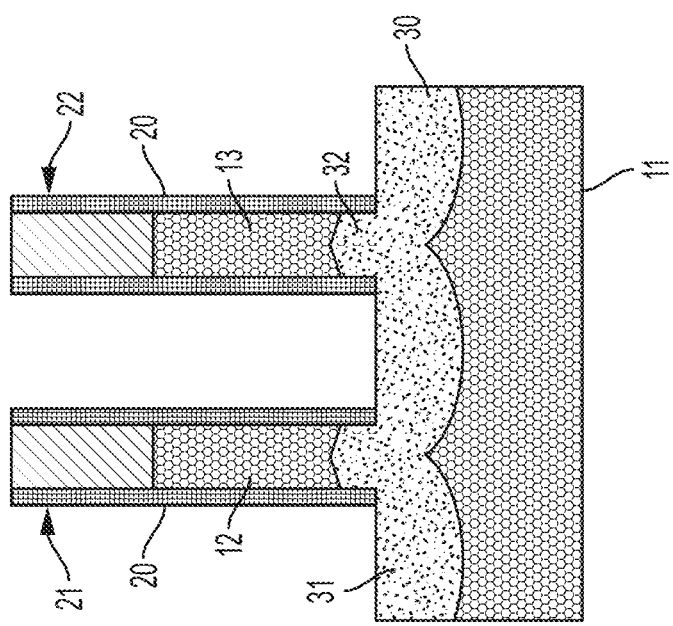

With reference to FIG. 3, bottom source/drain (S/D) junction regions 30 are formed to be self-aligned to the sacrificial spacers 20. The bottom S/D junction regions 30 may include a doped semiconductor layer 31 that is formed atop or as a part of the semiconductor substrate 11 and fin portions 32 that are formed to extend from the doped semiconductor layer 31 into respective bases of the first and second fins 12 and 13 of the first and second fin structures 21 and 22. The doped semiconductor layer 31 and the fin portions 32 may be formed by any suitable doping techniques such as ion implantation, plasma doping, in-situ doped epitaxial growth, solid phase doping, liquid phase doping, gas phase doping, etc. In some embodiments, a thermal anneal may be performed after dopant incorporation processing to activate dopants. In other embodiments, however, the thermal anneal step may be skipped.

In some embodiments, the doped semiconductor layer 31 and the fin portions 32 may include silicon germanium or silicon doped with p-type dopants such as boron, gallium or indium for p-type transistors, silicon germanium or silicon doped with n-type dopants such as phosphorus, arsenic or antimony for n-type transistors.

Where epitaxial growth processes are used to grow the doped semiconductor layer 31 and the fin portions 32, the doped semiconductor layer 31 and the fin portions 32 may be epitaxially grown using chemical vapor deposition (CVD), liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD) or other suitable processes.

Figure 4:
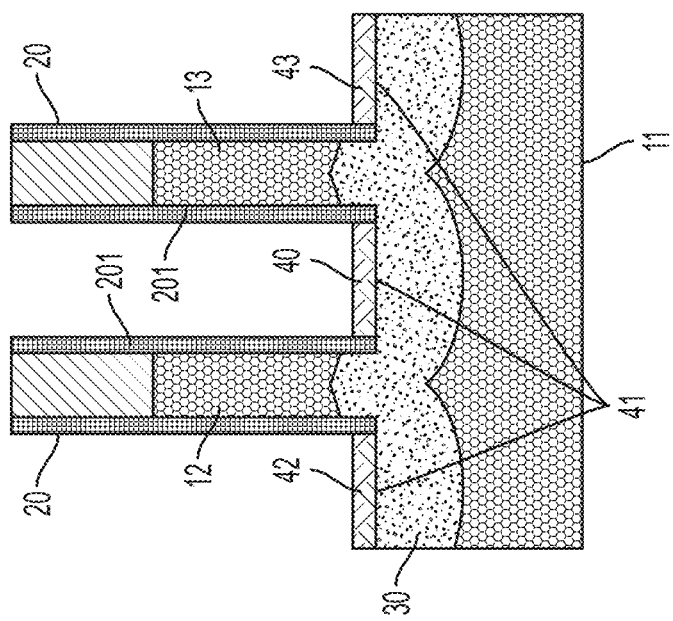

With reference to FIG. 4, a first rare earth oxide (REO) spacer 40 is epitaxially grown to have a substantially uniform thickness along respective upper surfaces 41 of the S/D junction regions 30 between the first and second fin structures 21 and 22, a second REO spacer 42 is epitaxially grown to have the substantially uniform thickness at a side of the first fin structure 21 and a third REO spacer 43 is epitaxially grown to have the substantially uniform thickness at an opposite side of the second fin structure 22.

In accordance with the present disclosure, the substantially uniform thickness is common to each of the first, second and third REO spacers 40, 42 and 43 and is enabled by the greater levels of control permitted by epitaxial growth as compared to what is possible using deposition and recess processing normally associated with spacer formation.

In accordance with embodiments, the first, second and third REO spacers 40, 42 and 43 may include or be formed of a single crystalline rare earth oxide material or of a combination of crystalline rare earth oxide materials. As used herein, rare earth elements include, but are not limited to, lanthanides such as lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) and lutetium (Lu).

In accordance with further embodiments, the first, second and third REO spacers 40, 42 and 43 may include any one or more of rare earth oxides such as erbium oxide ($Er_2O_3$), neodymium oxide ($Nd_2O_3$), praseodymium oxide ($Pr_2O_3$), cerium oxide ($CeO_2$), lanthanum oxide ($La_2O_3$), yttrium oxide ($Y_2O_3$), gadolinium oxide ($Gd_2O_3$), europium oxide ($Eu_2O_3$) and terbium oxide ($Tb_2O_3$). In accordance with still further embodiments, the first, second and third REO spacers 40, 42 and 43 may include combinations of rare earth oxides. In such cases, the first, second and third REO spacers 40, 42 and 43 may include a material such as $ABO_3$, where 'A' and 'B' may be any rare earth metal (e.g., lanthanum scandium oxide ($LaScO_3$) in an exemplary case or Perovskites such as strontium titanate ($SrTiO_3$) or barium titanate ($BaTiO_3$) in another exemplary case).

The ionic radii of rare earth elements decrease gradually with the atomic number, and the total variation of the ionic radii of rare earth elements is less than 15% among one another. The rare earth elements form various single crystalline dielectric oxides with a valance of +3, i.e., a dielectric oxide having a chemical formula of $M_2O_3$, in which M can be any of the rare earth elements.

Crystalline rare earth oxides are lattice coincident on a class of elemental or alloyed single crystalline semiconductor materials including single crystalline silicon, a single crystalline silicon-germanium alloy, a single crystalline silicon-carbon alloy and a single crystalline silicon-germanium-carbon alloy. For each single crystalline $M_2O_3$ in which M is a rare earth element, at least one single crystalline semiconductor material having a lattice constant that is one half the lattice constant of the single crystalline $M_2O_3$ exists among single crystalline silicon, a single crystalline silicon-germanium alloy, a single crystalline silicon-carbon alloy and a single crystalline silicon-germanium-carbon alloy.

For example, twice the lattice constant of silicon is between the lattice constant of gadolinium oxide ($Gd_2O_3$) and the lattice constant of neodymium oxide ($Nd_2O_3$). Thus, the composition of a single crystalline alloy of gadolinium oxide and neodymium oxide can be selected to match twice the lattice constant of silicon. In other words, the value x in the compound $Gd_{2-x}Nd_xO_3$ can be selected to provide a single crystalline compound having a lattice constant that is twice the lattice constant of silicon. In another example, twice the lattice constant of germanium is between the lattice constant of praseodymium oxide ($Pd_2O_3$) and the lattice constant of lanthanum oxide ($La_2O_3$). Thus, the composition of a single crystalline alloy of praseodymium oxide and lanthanum oxide can be selected to match twice the lattice constant of germanium. In other words, the value y in the compound $Pd_{2-y}La_yO_3$ can be selected to provide a single crystalline compound having a lattice constant that is twice the lattice constant of silicon.

In addition, crystalline rare earth oxides are lattice coincident on various single crystalline semiconductor materials that include III-V compound semiconductor materials and II-VI compound semiconductor materials. Thus, for each single crystalline $M_2O_3$ in which M is a rare earth element, at least one single crystalline compound semiconductor material having a lattice constant that is one half the lattice constant of the single crystalline $M_2O_3$ exists.

In yet another set of embodiments, the first, second and third REO spacers 40, 42 and 43 may include aluminum oxide $Al_2O_3$ or aluminum oxide compounds such as lanthanum aluminum ($LaAlO_3$) which may be deposited by atomic laser deposition (ALD), pulsed laser deposition (PLD) or other similar methods. Thus, it is to be understood that the description of crystalline dielectric layers herein are for illustrative purposes, and that any number, orientation, configuration, or combination of crystalline dielectric layers may be used in accordance with embodiments of the invention.

In accordance with embodiments, the first, second and third REO spacers 40, 42 and 43 may each have a substantially similar thickness of about 1-10 nm or, more particularly, in the range of about 3-5 nm, although thinner or thicker spacers are also conceived.

Figure 6:
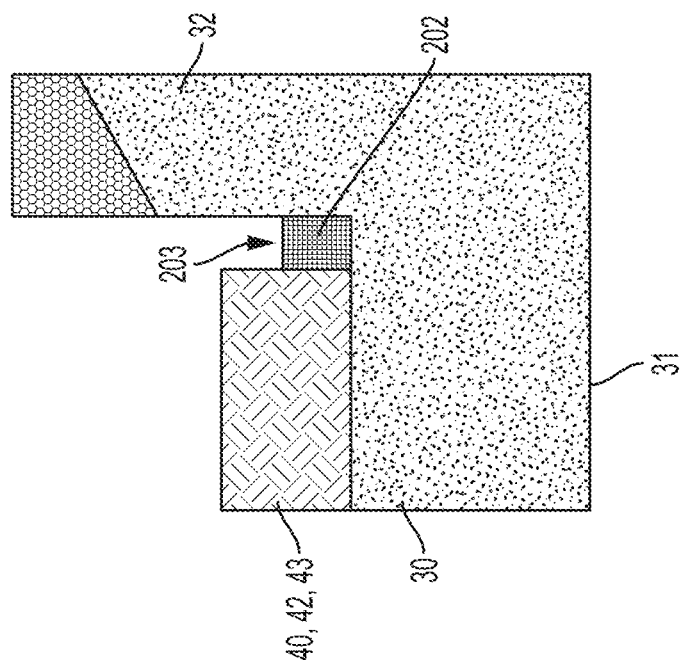
Figure 5:
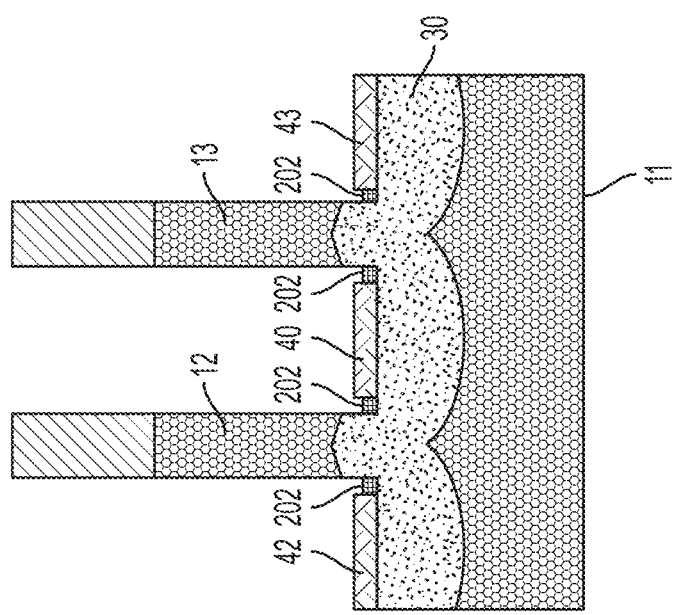

With reference to FIGS. 5 and 6, once the first, second and third REO spacers 40, 42 and 43 are grown, respective portions of the sacrificial spacers 20 are removed by an etching process or another similar type of process. As shown in FIGS. 5 and 6, such removal may involve the removal of respective upper portions 201 (see FIG. 4) of the sacrificial spacers 20, which are remote from the semiconductor substrate 11 and the S/D junction regions 30, while respective lower portions 202 thereof, which are proximate to the semiconductor substrate 11 and the S/D junction regions 30, remain in place. In such cases, a plane of upper surfaces of the respective lower portions 202 may be recessed toward the semiconductor substrate 11 from a plane of the first, second and third REO spacers 40, 42 and 43 thus defining a divot 203 above the respective lower portions 202. The divot 203 is therefore bounded on three sides by a sidewall of the corresponding one of the first, second and third REO spacers 40, 42 and 43, the upper surface of the corresponding one of the lower portions 202 and a sidewall of a corresponding one of the fin portions 32.

In accordance with alternative embodiments, it is to be understood that the entireties of the sacrificial spacers 20 may be removed. In such cases, the divot 203 described above would be bounded on three sides by the sidewall of the corresponding one of the first, second and third REO spacers 40, 42 and 43, the upper surface of the corresponding one of the S/D junction regions 30 and the sidewall of the corresponding one of the fin portions 32.

With reference now to FIGS. 7-14, once the respective portions of the sacrificial spacers 20 are removed, the removed portions are effectively replaced with components of the vertical transistors which are formed on the first and second fins 12 and 13. For purposes of clarity and brevity, the following description of the formation of the components of the vertical transistors will relate to the case in which the respective lower portions 202 of the sacrificial spacers 20 remain in position and that alternative embodiments in which the entireties of the sacrificial spacers 20 are removed would be generally similar and need not be described in detail.

Figure 7:
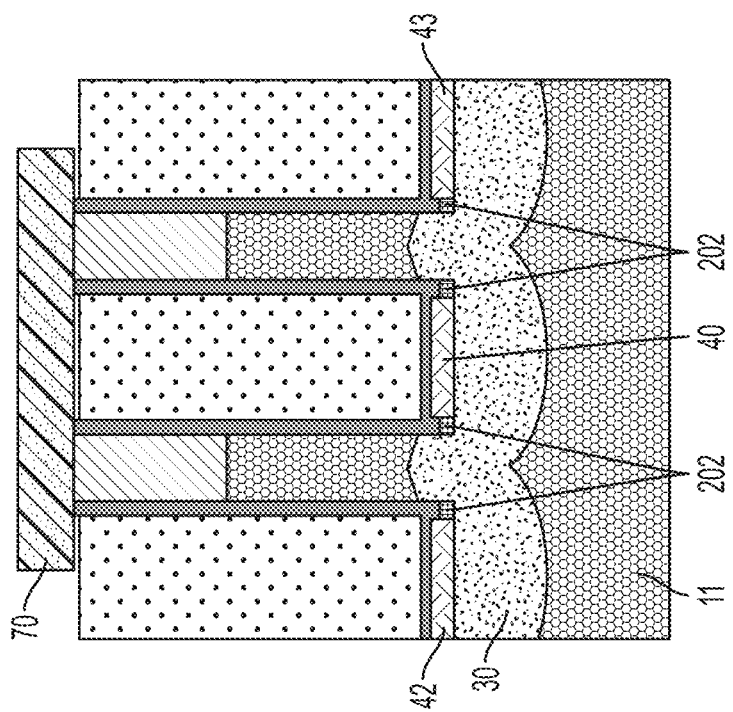

As shown in FIG. 7, portions of a high-k dielectric layer 50 and metal gates 60 are laid down. At this point, the portions of the high-k dielectric layer 50 include divot portions 51, lower layer portions 52 and sidewall portions 53. The divot portions 51 sit within the divots 203, the lower layer portions 52 sits atop respective upper surfaces of the first, second and third REO spacers 40, 42 and 43 and the divot portions 51 and the sidewall portions 53 extend vertically upwardly from the lower layer portions 52 along the sidewalls of the first and second fins 12 and 13 and the hard masks 14. The metal gates 60 sit within the regions bounded by the portions of the high-k dielectric layer 50.

In accordance with embodiments, the portions of the high-k dielectric layer 50 described above may include silicon oxide, silicon nitride, silicon oxynitride, boron nitride, high-k materials or any combinations thereof. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide and lead zinc niobate. The portions of the high-k dielectric layer 50 may further include dopants such as lanthanum and aluminum.

The portions of the high-k dielectric layer 50 may be formed by various methods that are well known in the art including, for example, chemical vapor deposition (CVD), atomic layer deposition (ALD), molecular beam deposition (MBD), pulsed laser deposition (PLD), liquid source misted chemical deposition (LSMCD), etc. A thickness of the portions of the high-k dielectric layer 50 may be about 1-10 nm and, more particularly, about 1.5-3 nm. The portions of the high-k dielectric layer 50 can have an effective oxide thickness (EOT) on the order of, or less than, about 1 nm.

In accordance with further embodiments, the metal gates 60 may be formed of polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotubes, conductive carbon or any suitable combinations thereof. The conductive material may further include dopants that are incorporated during or after deposition. The gate metal can be deposited directly on the top surface of the high-k dielectric layer by, for example, chemical vapor deposition (CVD), physical vapor deposition (PVD) or atomic layer deposition (ALD). As non-limiting examples, the gate metal can also include a metal system or alloy selected from one or more of titanium nitride (TiN), titanium carbide (TiC), tantalum nitride (TaN), tantalum carbide (TaC), tantalum silicon nitride (TaSiN), hafnium nitride (HfN), Tungsten (W), aluminum (Al) and ruthenium (Ru), and can be selected at least in part based on the desired work function (WF) of the device (whether the device is a vertical NFET or a vertical PFET).

Still referring to FIG. 7, once the portions of the high-k dielectric layer 50 and the metal gates 60 are deposited or laid down, the exposed upper surfaces may be planarized by chemical mechanical polishing, for example. The resulting planar upper surfaces are thus prepared for further processing.

Figure 8:
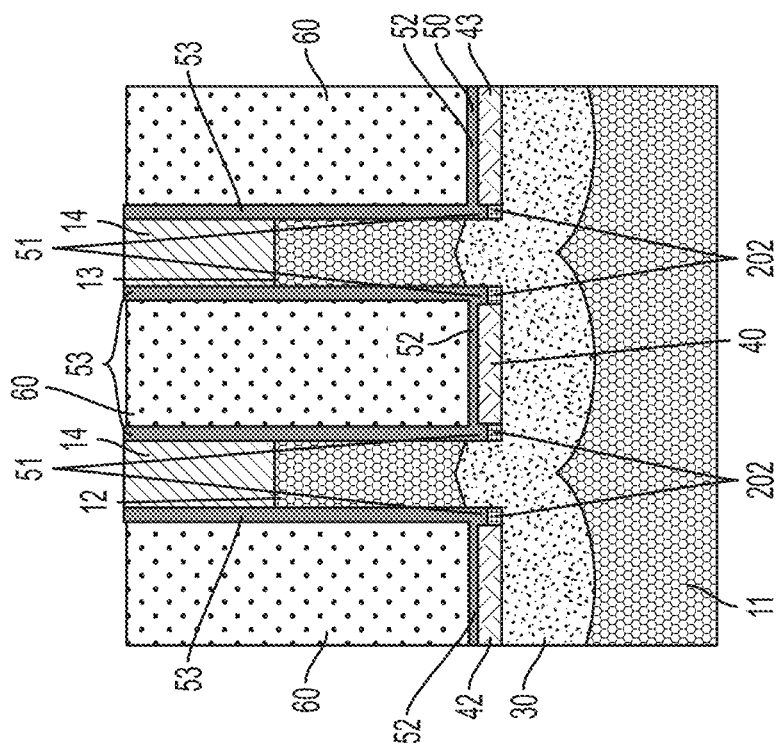
Figure 10:
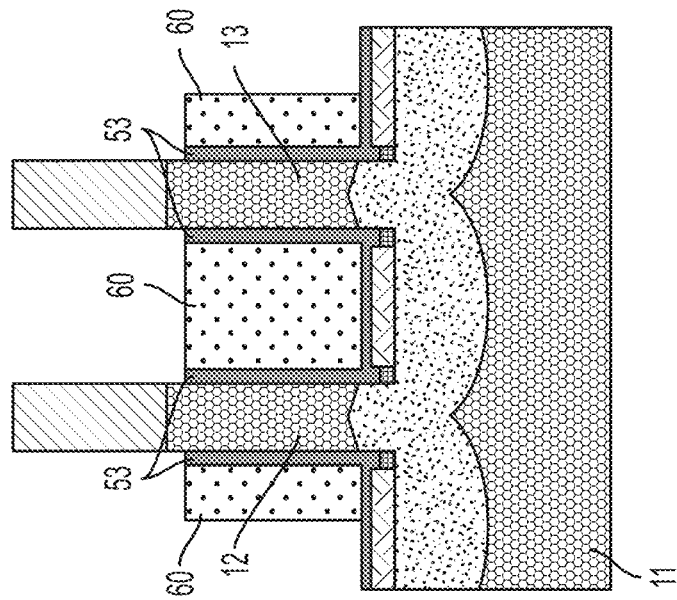
Figure 9:
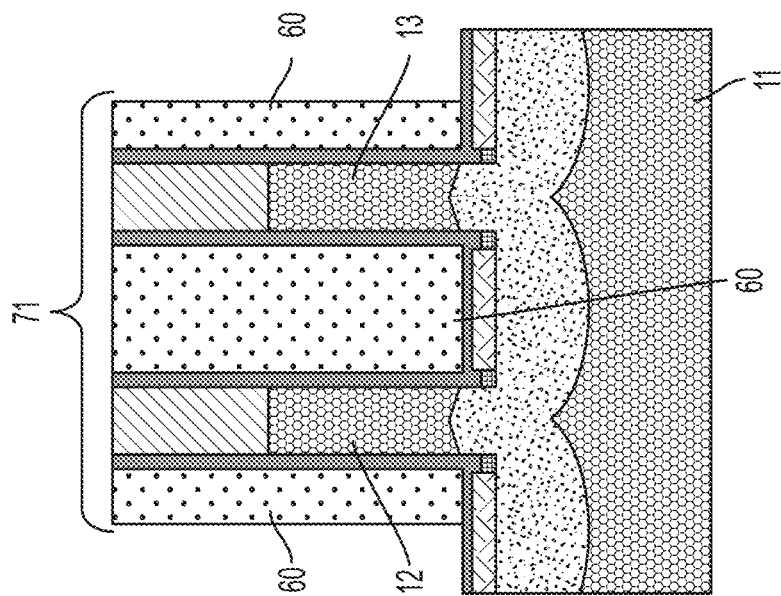

As shown in FIGS. 8 and 9, the further processing initially includes the forming and laying down of a gate cut mask 70 and a subsequent patterning of the metal gates 60. The patterning can be conducted using any appropriate lithographic or etching process and results in the patterned metal gate 71 of FIG. 9. As shown in FIG. 10, the patterning is followed by an anisotropic etch process, such as RIE, to recess the high-k dielectric layer 50 and the metal gates 60.

Figure 12:
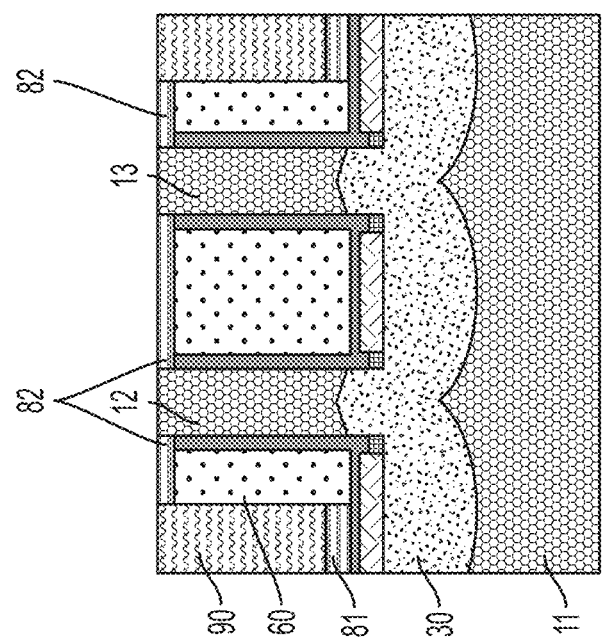
Figure 11:
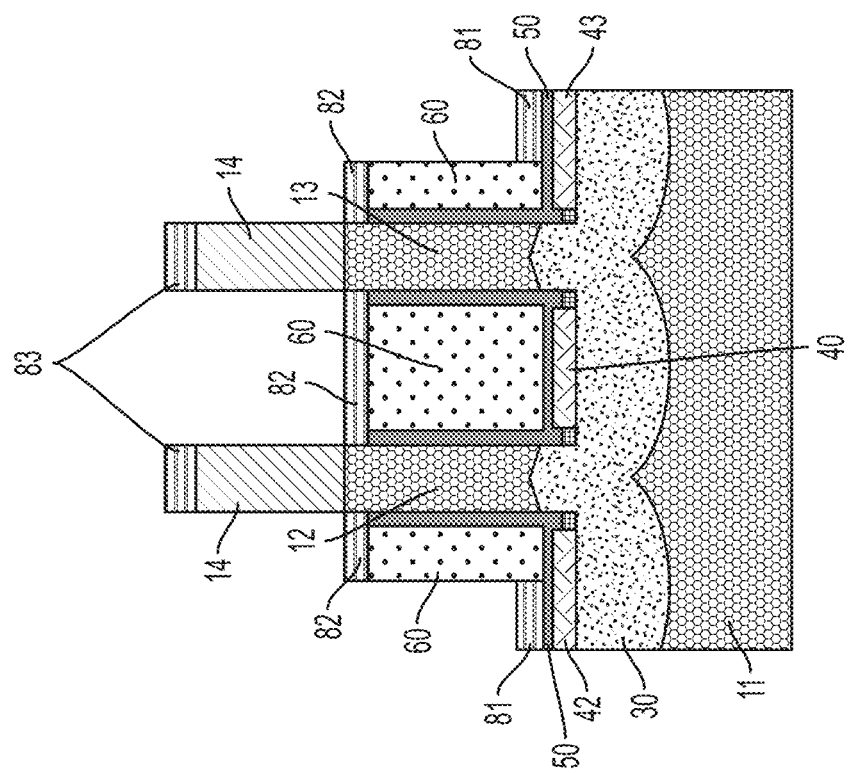

As shown in FIG. 11, once the anisotropic etch process of FIG. 10 is complete, top spacer layers 80 are formed and laid down by directional deposition or another similar depositional process. The top spacer layers 80 may include first top spacer layer elements 81, second top spacer layer elements 82 and third top spacer layer elements 83. The first top spacer layer elements 81 may be formed and laid down on exposed regions of the lower layer portions 52, the second top spacer layer elements 82 may be formed and laid down on upper surfaces of the sidewall portions 53 and the metal gates 60 and the third top spacer layer elements 83 may be formed and laid down on upper surfaces of the had masks 14. Next, as shown in FIG. 12, an interlayer dielectric layer (ILD) 90 is deposited with such deposition followed by CMP processing to remove the third top spacer layer elements 83 and the hard masks 14 and to planarize the resulting upper surfaces of the ILD 90, the second top spacer elements 82 and the first and second fins 12 and 13. The top spacer can be composed of silicon oxide, silicon nitride, boron nitride, silicon carbon or any suitable combination of those materials.

Figure 14:
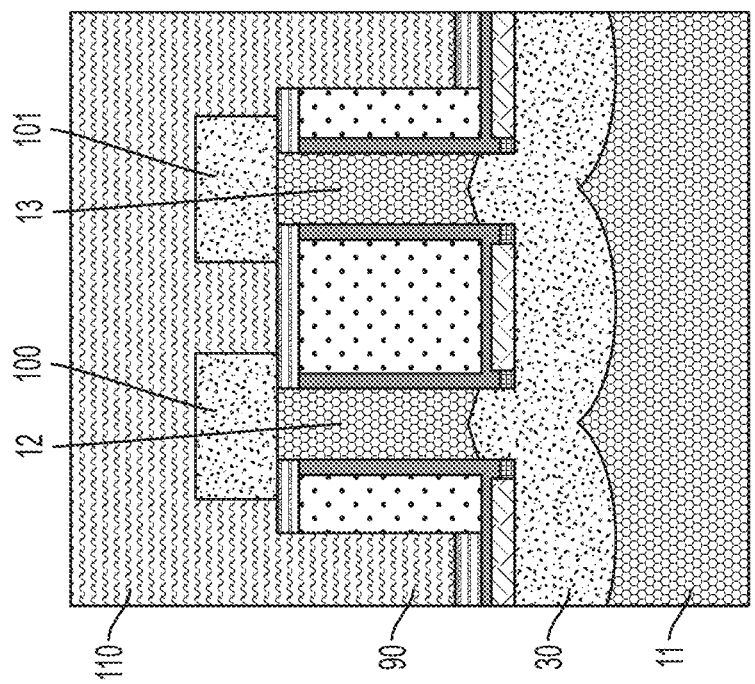
Figure 13:
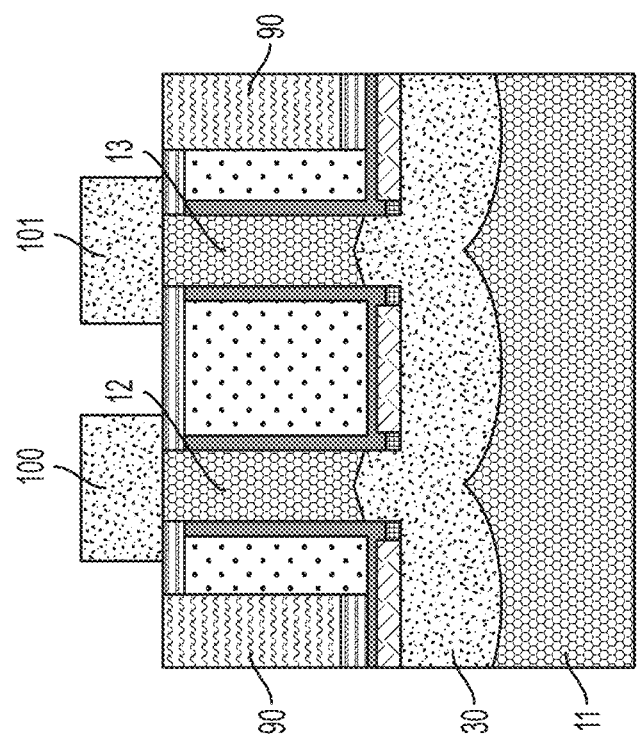

At this point, as shown in FIGS. 13 and 14, first and second top S/D contacts 100 and 101 are epitaxially grown at the upper surfaces of the first and second fins 12 and 13, respectively, and additional ILD 110 is deposited over the entire device once the first and second top S/D contacts 100 and 101 are completely grown.

In accordance with embodiments, epitaxial growth processes for the first and second top S/D contacts 100 and 101, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD), liquid-phase epitaxy (LPE), molecular beam epitaxy (MBE) and metal-organic chemical vapor deposition (MOCVD). The temperature range for such epitaxial growth processes can be, for example, 550° C. to 900° C., but is not necessarily limited thereto, and the processes may be conducted at higher or lower temperatures as needed.

A number of different sources may be used for the epitaxial growth. For example, the sources may include precursor gas or gas mixtures including, for example, silicon containing precursor gas (such as silane) and/or a germanium containing precursor gas (such as a germane). Carrier gases like hydrogen, nitrogen, helium and argon can be used.

In accordance with other embodiments, the first and second top S/D contacts 100 and 101 may include a single crystalline semiconductor material. This single crystalline semiconductor material can be selected from, but is not limited to, silicon, a silicon germanium alloy, a silicon carbon alloy, a silicon germanium carbon alloy, a III-V compound semiconductor material, a II-VI compound semiconductor material, and an alloy or a combination thereof.

Descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a spacer for a vertical transistor, the method comprising:
    forming a fin structure comprising a fin on a semiconductor substrate;
    forming a source junction or a drain junction at an upper surface of the semiconductor substrate and at a base of the fin; and
    epitaxially growing a rare earth oxide (REO) spacer to have a substantially uniform thickness along respective upper surfaces of the source or drain junction and on opposite sides of the fin structure.

2. The method according to claim 1, further comprising forming a sacrificial spacer on a sidewall of the fin by deposition and reactive ion etch (REI) processing.

3. The method according to claim 2, further comprising replacing at least a portion of the sacrificial spacer by removing an upper portion of the sacrificial spacer remote from the respective upper surfaces of the source or drain junction while maintaining a lower portion of the sacrificial spacer proximate to the respective upper surfaces of the source or drain junction.

4. The method according to claim 2, further comprising replacing the sacrificial spacer by removing an entirety of the sacrificial spacer.

5. The method according to claim 1, wherein the forming of the source or drain junction comprises at least one or more of plasma doping followed by annealing processing and ion implantation processing.

6. The method according to claim 1, wherein the epitaxial growing of the REO spacer comprises at least one of atomic laser deposition (ALD) processing and pulsed laser deposition (PLD) processing.

7. The method according to claim 1, wherein the REO spacer comprises at least one of a single crystallized rare earth metal and a combination of crystallized rare earth metals.

8. The method according to claim 1, wherein the REO spacer has a thickness of about 1-10 nm.

9. The method according to claim 1, wherein the REO spacer has a thickness of about 3-5 nm.

10. A method of forming a uniform spacer for vertical transistors, the method comprising:
    forming first and second fin structures on a semiconductor substrate, the first and second fin structures each comprising a fin and sacrificial spacers on respective sidewalls of the fin;
    forming source/drain (S/D) junctions at an upper surface of the semiconductor substrate and at respective bases of the fins of each of the first and second fin structures;
    epitaxially growing a rare earth oxide (REO) spacer to have a substantially uniform thickness along respective upper surfaces of the S/D junctions between and at opposite sides of each of the first and second fin structures; and
    replacing at least respective portions of the sacrificial spacer of each of the first and second fin structures with components of the vertical transistors.

11. The method according to claim 10, wherein the forming of the sacrificial spacer of each of the first and second fin structures comprises deposition and reactive ion etch (RIE) processing.

12. The method according to claim 10, wherein the forming of the S/D junctions comprises at least one or more of plasma doping followed by annealing processing and ion implantation processing.

13. The method according to claim 10, wherein the epitaxial growing of the REO spacer comprises at least one of atomic laser deposition (ALD) processing and pulsed laser deposition (PLD) processing.

14. The method according to claim 10, wherein the REO spacer comprises at least one of a single crystallized rare earth metal and a combination of crystallized rare earth metals.

15. The method according to claim 10, wherein the REO spacer has a thickness of about 1-10 nm.

16. The method according to claim 10 wherein the REO spacer has a thickness of about 3-5 nm.

17. The method according to claim 10, wherein the replacing of at least the respective portions of the sacrificial spacer of each of the first and second fin structures comprises:
    removing respective upper sacrificial spacer portions remote from the upper surfaces of the S/D junctions; and
    maintaining respective lower sacrificial spacer portions proximate to the upper surfaces of the S/D junctions.

18. The method according to claim 10, wherein the replacing of at least the respective portions of the sacrificial spacer of each of the first and second fin structures comprises removing entireties of the sacrificial spacers.

19. A vertical transistor structure, comprising:
    a semiconductor substrate;
    first and second fins extending upwardly from first and second doped regions of the semiconductor substrate, respectively;
    first and second vertical transistor structures disposed on the first and second fins, respectively; and
    an epitaxially grown rare earth oxide (REO) spacer with a substantially uniform thickness which is disposed between respective upper surfaces of the first and second doped regions of the semiconductor substrate and respective lower surfaces of the first and second vertical transistor structures and between and at opposite sides of the first and second fins.

20. The vertical transistor structure according to claim 19, further comprising divot portions formed from sacrificial spacers disposed between the REO spacer and the opposite sides of the first and second fins.

* * * * *